(12) United States Patent
Miyamoto et al.

(10) Patent No.: US 9,027,504 B2
(45) Date of Patent: May 12, 2015

(54) HEATING APPARATUS, COATING APPARATUS AND HEATING METHOD

(75) Inventors: Hidenori Miyamoto, Kawasaki (JP); Tsutomu Sahoda, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 131 days.

(21) Appl. No.: 13/484,625

(22) Filed: May 31, 2012

(65) Prior Publication Data
US 2012/0304921 A1 Dec. 6, 2012

Related U.S. Application Data

(60) Provisional application No. 61/492,627, filed on Jun. 2, 2011.

(51) Int. Cl.
| | | |
|---|---|---|
| B05C 13/02 | (2006.01) |
| F24J 3/00 | (2006.01) |
| F27B 5/16 | (2006.01) |
| H01L 21/67 | (2006.01) |
| H01L 21/677 | (2006.01) |
| H01L 31/032 | (2006.01) |

(52) U.S. Cl.
CPC .... *H01L 21/67173* (2013.01); *H01L 21/67109* (2013.01); *H01L 21/67253* (2013.01); *H01L 21/6776* (2013.01); *Y02E 10/541* (2013.01); *H01L 31/0322* (2013.01); *H01L 31/0326* (2013.01)

(58) Field of Classification Search
USPC .......... 118/58–60, 62–64; 432/258, 253, 227, 432/120, 200; 211/41.18; 206/454; 148/527; 99/373
See application file for complete search history.

(56) References Cited

U.S. PATENT DOCUMENTS

| | | | | |
|---|---|---|---|---|
| 2,571,891 | A * | 10/1951 | Kassan et al. ................... 99/373 |
| 4,438,685 | A * | 3/1984 | Haas et al. ...................... 99/342 |
| 5,045,409 | A | 9/1991 | Eberspacher et al. |
| 5,142,967 | A * | 9/1992 | Herting ........................... 99/373 |
| 5,607,009 | A * | 3/1997 | Turner et al. ................. 165/48.1 |
| 6,436,482 | B2 * | 8/2002 | Katsumata ..................... 427/493 |
| 2002/0063846 | A1 * | 5/2002 | Matsuura et al. ............. 349/189 |
| 2005/0009229 | A1 | 1/2005 | Mitzi |

FOREIGN PATENT DOCUMENTS

| | | |
|---|---|---|
| JP | A-01-231313 | 9/1989 |
| JP | A-11-273783 | 10/1999 |
| JP | A-11-340482 | 12/1999 |
| JP | A-2005-051224 | 2/2005 |
| JP | A-2009-537997 | 10/2009 |
| WO | WO 2007/134843 | 11/2007 |

* cited by examiner

*Primary Examiner* — Yewebdar Tadesse
(74) *Attorney, Agent, or Firm* — Knobbe Martens Olson & Bear LLP

(57) ABSTRACT

A heating apparatus including: a first heating part and a second heating part between which a substrate having a coating film is disposed at a substrate position in the film thickness direction; and a distance control part which controls at least one of a first distance between the substrate position and the first heating part and a second distance between the substrate position and the second heating part.

10 Claims, 13 Drawing Sheets

HEATING APPARATUS, COATING APPARATUS AND HEATING METHOD

Priority is claimed on Provisional Application No. 61/492,627, filed on Jun. 2, 2011, the content of which is incorporated herein by reference.

FIELD OF THE INVENTION

The present invention relates to a heating apparatus, a coating apparatus and a heating method.

DESCRIPTION OF THE RELATED ART

A CIGS solar cell or a CZTS solar cell formed by semiconductor materials including a metal such as Cu, Ge, Sn, Pb, Sb, Bi, Ga, In, Ti, Zn, and a combination thereof, and a chalcogen element such as S, Se, Te, and a combination thereof has been attracting attention as a solar cell having high conversion efficiency (for example, see Patent Documents 1 to 3).

For example, a CIGS solar cell has a structure in which a film including four types of semiconductor materials, namely, Cu, In, Ga, and Se is used as a light absorbing layer (photoelectric conversion layer). Further, for example, a CZTS solar cell has a structure in which a film including four types of semiconductor materials, namely, Cu, Zn, Sn, and Se is used as a light absorbing layer (photoelectric conversion layer). In such solar cells, a configuration is known in which a back electrode made of molybdenum is provided on a substrate such a glass, and the aforementioned light absorbing layer is provided on the back electrode.

In a CIGS solar cell or a CZTS solar cell, since it is possible to reduce the thickness of the light absorbing layer compared to a conventional solar cell, it is easy to install the CIGS solar cell on a curved surface and to transport the CIGS solar cell. For this reason, it is expected that CIGS solar cells can be used in various application fields as a high-performance, flexible solar cell. As a method of forming the light absorbing layer, a method of forming the light absorbing layer through depositing or sputtering is conventionally known (for example, see Patent Documents 2 to 5).

DOCUMENTS OF RELATED ART

Patent Documents

[Patent Document 1] Japanese Unexamined Patent Application, First Publication No. Hei 11-340482
[Patent Document 2] Japanese Unexamined Patent Application, First Publication No. 2005-51224
[Patent Document 3] Published Japanese Translation No. 2009-537997 of the PCT International Publication
[Patent Document 4] Japanese Unexamined Patent Application, First Publication No. Hei 1-231313
[Patent Document 5] Japanese Unexamined Patent Application, First Publication No. Hei 11-273783

SUMMARY OF THE INVENTION

In contrast, as the method of forming the light absorbing layer, the present inventor proposes a method of coating the semiconductor materials in the form of a liquid material on a substrate. In such a method of forming the light absorbing layer by coating the semiconductor materials in the form of a liquid material, the following problems arise.

After coating the liquid material, a baking step in which the coating film is heated is conducted. This baking step influences the properties of the coating film as a light-absorbing layer. Therefore, it is necessary to conduct heating under optimized conditions. For forming a coating film having desired properties, a configuration in which the heating conditions are adjustable is demanded.

The present invention takes the above circumstances into consideration, with an object of providing a heating apparatus, a coating apparatus and a heating method which enable formation of a coating film having desired properties.

A heating apparatus according to a first aspect of the present invention includes: a first heating part and a second heating part between which a substrate having a coating film is disposed at a substrate position in the film thickness direction, and a distance control part which controls at least one of a first distance between the substrate position and the first heating part and a second distance between the substrate position and the second heating part.

According to the present invention, by virtue of being provided with a first heating part and a second heating part between which a substrate having a coating film is disposed at a substrate position in the film thickness direction, and a distance control part which controls at least one of a first distance between the substrate position and the first heating part and a second distance between the substrate position and the second heating part, the heating conditions for the coating film can be controlled. As a result, a coating film having desired properties can be formed.

In the heating apparatus, the distance control part may have a moving part which moves at least one of the first heating part and the second heating part in the film thickness direction.

According to this embodiment, by virtue of moving at least one of the first heating part and the second heating part in the film thickness direction, the heating conditions can be flexibly changed.

In the heating apparatus, the first heating part and the second heating part may be arranged to be aligned in a vertical direction.

According to this embodiment, by virtue of arranging the first heating part and the second heating part to be aligned in a vertical direction, the substrate can be reliably disposed between the first heating part and the second heating part.

The heating apparatus may further include a substrate holding part which holds the substrate disposed at the substrate position.

According to this embodiment, by virtue of including a substrate holding part which holds the substrate disposed at the substrate position, heating of the coating film can be conducted in a state where the position or the posture of the substrate is stable.

In the heating apparatus, either one of the first heating part and the second heating part which is disposed on a lower side of the substrate position in a vertical direction serves as the substrate holding part.

According to this embodiment, by virtue of either one of the first heating part and the second heating part which is disposed on a lower side of the substrate position in a vertical direction serving as the substrate holding part, space can be saved, as compared to the case where a substrate holding part is separately provided.

In the heating apparatus, the distance control part controls at least one of the first distance and the second distance such that either one of the first heating part and the second heating part which is disposed on an upper side of the substrate position in a vertical direction does not come in contact with the coating film.

According to this embodiment, by virtue of conducting heating in a state where either one of the first heating part and the second heating part which is disposed on an upper side of the substrate position in a vertical direction does not come in contact with the coating film, breakage of the coating film can be prevented.

The heating apparatus may further include a chamber which surrounds the substrate position, the first heating part and the second heating part.

According to this embodiment, by virtue of being provided with a chamber which surrounds the substrate position, the first heating part and the second heating part, heating can be efficiently conducted under conditions where the atmosphere can be easily controlled.

In the heating apparatus, the chamber may have a gas introduction part which introduces a gas.

According to this embodiment, by virtue of the chamber having a gas introduction part which introduces a gas, the atmosphere inside the chamber can be maintained or changed by introducing a gas from the gas introduction part.

In the heating apparatus, the gas introduction part may be provided to sandwich at least one of the first heating part and the second heating part between the gas introduction part and the substrate position.

According to this embodiment, by virtue of the gas introduction part being provided to sandwich at least one of the first heating part and the second heating part between the gas introduction part and the substrate position, the gas can be prevented from being directly jetted to the substrate.

In the heating apparatus, the chamber may have a gas exhaust part which exhausts a gas.

According to this embodiment, by virtue of the chamber having a gas exhaust part which exhausts a gas, the atmosphere inside the chamber can be maintained or changed by exhausting a gas from the gas exhaust part.

In the heating apparatus, the chamber may have a gas introduction part which introduces a gas and a gas exhaust part which exhausts the gas, wherein the gas introduction part and the gas exhaust part are disposed to sandwich the substrate position.

According to this embodiment, by virtue of the chamber having a gas introduction part which introduces a gas and a gas exhaust part which exhausts the gas, wherein the gas introduction part and the gas exhaust part are disposed to sandwich the substrate position, the gas stream can be prevented from directly influencing the substrate during the introduction of the gas and the exhaustion of the gas.

A coating apparatus according to a second aspect of the present invention includes: a coating part which forms a coating film of a liquid material containing an oxidizable metal and a solvent on a substrate; a heating part which heats the substrate having the coating film formed thereon; and a transporting part which transports the substrate between the coating part and the heating part, wherein a heating apparatus according to a first aspect of the present invention is used as the heating part.

According to the present invention, by virtue of being provided with a coating part which forms a coating film of a liquid material containing an oxidizable metal and a solvent on a substrate, a heating part which heats the substrate having the coating film formed thereon, and a transporting part which transports the substrate between the coating part and the heating part, wherein a heating apparatus capable of controlling the heating conditions of the coating film is used as the heating part, a coating film having desired properties can be stably formed.

A heating method according to a third aspect of the present invention includes: a heating step in which a first heating part and a second heating part sandwiching a substrate position at which a substrate with a coating film is disposed in a film thickness direction of the coating film are used to heat the substrate; and a distance controlling step in which at least one of a first distance between the substrate position and the first heating part and a second distance between the substrate position and the second heating part is controlled.

According to the present invention, by virtue of using a first heating part and a second heating part sandwiching a substrate position at which a substrate with a coating film is disposed in a film thickness direction of the coating film to heat the substrate, and controlling at least one of a first distance between the substrate position and the first heating part and a second distance between the substrate position and the second heating part, the heating conditions of the coating film can be controlled. As a result, a coating film having desired properties can be formed.

In the heating method, the distance controlling step may be performed while heating the substrate.

According to this embodiment, by virtue of controlling the heating conditions of the coating film while heating the substrate, a coating film having the desired properties can be more reliably formed.

According to the present invention, a coating film having desired properties can be formed.

MODE FOR CARRYING OUT THE INVENTION

Hereinafter, one embodiment of the present invention will be described with reference to the accompanying drawings.

Figure 1:
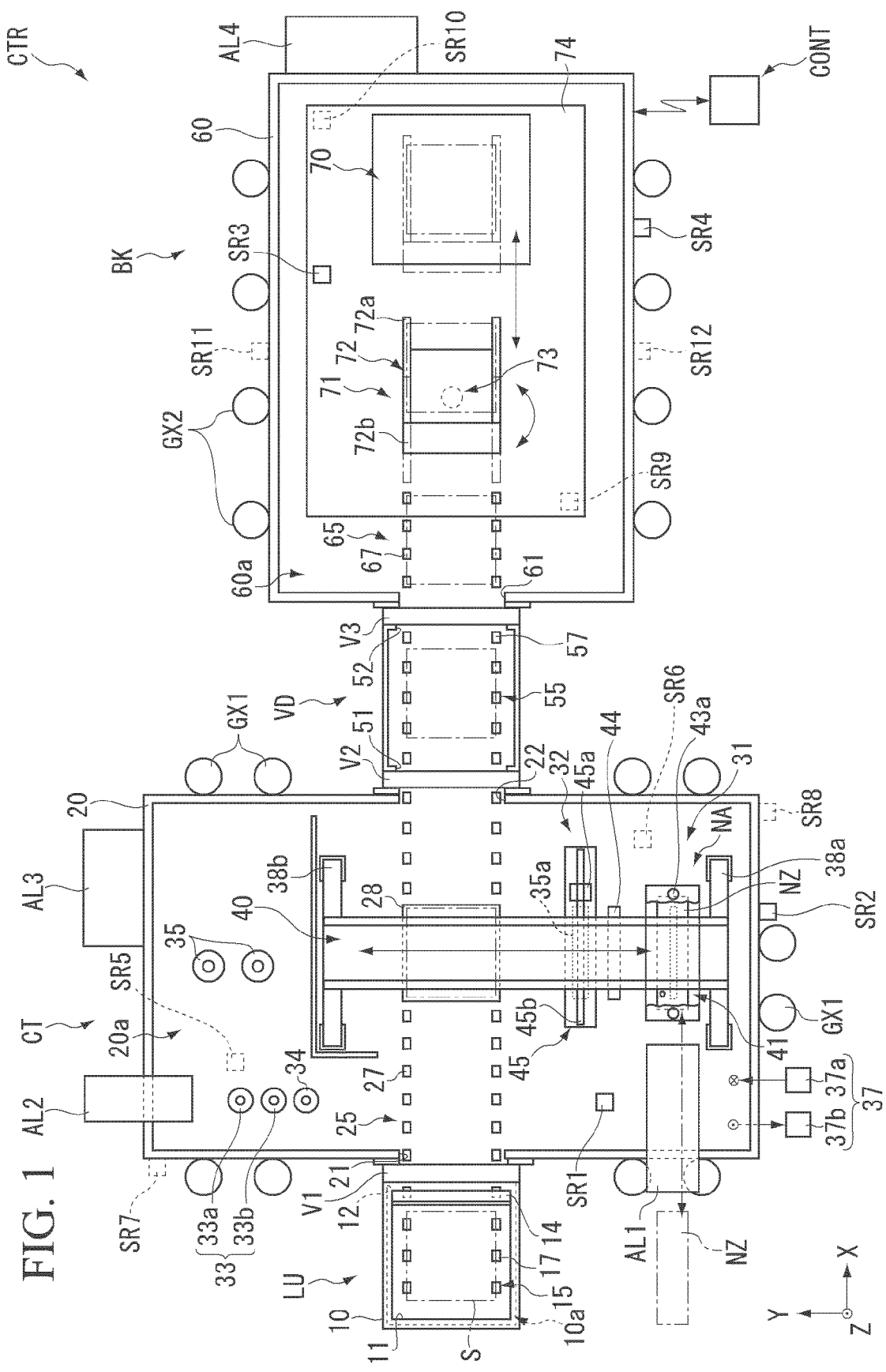
FIG. 1 is a diagram showing an entire configuration of a coating apparatus according to one embodiment of the present invention.

FIG. 1 is a schematic diagram showing a configuration of a coating apparatus CTR according to one embodiment of the present invention.

As shown in FIG. 1, the coating apparatus CTR is an apparatus which applies a liquid material to a substrate S. The coating apparatus CTR includes a substrate loading/unloading part LU, a coating part CT, a vacuum drying part VD, a baking part BK and a control part CONT.

The coating apparatus CTR is used, for example, by being disposed on a floor FL in a factory. The coating apparatus may have a configuration in which the coating apparatus is accommodated in one room, or a configuration in which the coating apparatus is divisionally accommodated in a plurality of rooms. In the coating apparatus CTR, the substrate loading/unloading part LU, the coating part CT, the vacuum drying part VD and the baking part BK are arranged in this order in one direction.

With respect to the configuration of the coating apparatus CTR, it is not particularly limited that the substrate loading/unloading part LU, the coating part CT, the vacuum drying part VD and the baking part BK are arranged in this order in one direction. For example, the substrate loading/unloading part LU may be divided into a substrate loading part (not shown) and a substrate unloading part (not shown). Further, the vacuum drying part VD may be omitted. Needless to say, the aforementioned parts may not be arranged in one direction, and a configuration may be employed in which the aforementioned parts are arranged to be stacked in a vertical or horizontal direction with a robot (not shown) disposed at a central position.

In the respective drawings as below, upon describing the configuration of a substrate treating apparatus according to the present embodiment, for the purpose of simple marking, an XYZ coordinate system is used to describe the directions in the drawings. In the XYZ coordinate system, the plane parallel to the floor is regarded as the XY plane. On the XY plane, the direction in which the components of the coating apparatus CTR (the substrate loading/unloading part LU, the coating part CT, the vacuum drying part VD and the baking part BK) are arranged is marked as the X direction, and the direction perpendicular to the X direction on the XY plane is marked as the Y direction. The direction perpendicular to the XY plane is marked as the Z direction. In the X, Y, and Z directions, the arrow direction in the drawing is the +direction, and the opposite direction of the arrow direction is the −direction.

In this embodiment, as the substrate S, for example, a plate-shaped member made of glass, resin, or the like may be used. Further, in this embodiment, molybdenum is sputtered on the substrate S as a back electrode. Needless to say, any other electroconductive material may be used as a back electrode. Explanation will be given below, taking an example of a substrate having a size of 330 mm×330 mm as viewed in the Z direction. The size of the substrate is not limited to 330 mm×330 mm. For example, as the substrate S, a substrate having a size of 125 mm×125 mm may be used, or a substrate having a size of 1 m×1 m may be used. Needless to say, a substrate having a size larger than the aforementioned sizes or a substrate having a size smaller than the aforementioned sizes may be appropriately used.

In this embodiment, as the liquid material to be applied to the substrate S, for example, a liquid composition is used which includes a solvent such as hydrazine and oxidizable metals such as a combination of copper (Cu), indium (In), gallium (Ga), and selenium (Se) or a combination of copper (Cu), zinc (Zn), tin (Sn) and selenium (Se). The liquid composition includes a metal material for forming a light absorbing layer (photoelectric conversion layer) of a CIGS solar cell or a CZTS solar cell.

In the present embodiment, the liquid composition contains a substance for obtaining the grain size of a light absorbing layer of a CIGS solar cell or a CZTS solar cell. Needless to say, as the liquid material, a liquid material in which another oxidizable metal is dispersed in the solution may be used.

(Substrate Loading/Unloading Part)

The substrate loading/unloading part LU loads a substrate S prior to being treated on the coating part CT, and unloads the treated substrate S from the coating part CT. The substrate loading/unloading part LU has a chamber 10. The chamber 10 is formed in the shape of a rectangular box. Inside the chamber 10, an accommodation room 10a capable of accommodating the substrate S is formed. The chamber 10 has a first opening 11, a second opening 12 and a lid portion 14. The first opening 11 and the second opening 12 communicates the accommodation room 10a with the outside of the chamber 10.

The first opening 11 is formed on a +Z-side face of the chamber 10. The first opening 11 is formed to have a size larger than the size of the substrate S as viewed in the Z direction. The substrate S to be taken out of the chamber 10 or the substrate S to be accommodated in the accommodation room 10a is place into or taken out of the substrate loading/unloading part LU through the first opening 11.

The second opening 12 is formed on a +X-side face of the chamber 10. The second opening 12 is formed to have a size larger than the size of the substrate S as viewed in the X direction. The substrate S supplied to the coating part CT or the substrate S returned from the coating part CT is place into or taken out of the substrate loading/unloading part LU through the second opening 12.

The lid portion 14 opens or closes the first opening 11. The lid portion 14 is formed in the shape of a rectangular plate. The lid portion 14 is attached to a +X-side edge of the first opening 11 via a hinge portion (not shown). Thus, the lid portion 14 is rotatable around the Y-axis, with the +X-side edge of the first opening 11 as the center. By rotating the lid portion 14 around the Y-axis, the first opening 11 can be opened or closed.

The accommodation room 10a is provided with a substrate transporting part 15. The substrate transporting part 15 includes a plurality of rollers 17. The rollers 17 are arranged in a pair in the Y-direction, and a plurality of the pairs are arranged in the X-direction.

Each of the rollers 17 is adapted to be rotatable about the Y direction serving as the central axis. The plurality of rollers 17 are formed to have the same diameter, and the +Z-side end of the plurality of rollers 17 are arranged on a same plane parallel to the XY plane. Thus, the plurality of rollers 17 are capable of supporting the substrate S in a state where the substrate S is parallel to the XY plane.

The rotation of each of the rollers 17 is controlled, for example, by a roller-rotation control part (not shown). By rotating each of the rollers 17 clockwise or anti-clockwise around the Y-axis in a state where the substrate S is supported by the plurality of rollers 17, the substrate transporting part 15 can transport the substrate S in an X-direction (+X-direction or −X-direction). As the substrate transporting part 15, a float transporting part (not shown) may be used to lift the substrate for transportation.

(Coating Part)

The coating part CT performs the coating treatment of the liquid material on the substrate S. The coating part CT includes a chamber 20 and a base BC. The coating part CT has a configuration in which the chamber 20 is mounted on the base BC placed on the floor FL.

The chamber 20 is formed in the shape of a rectangular box. Inside the chamber 20, a treatment room 20a is formed. The chamber 20 has a first opening 21 and a second opening 22. The first opening 21 and the second opening 22 communicates the treatment room 20a with the outside of the chamber 20.

The first opening 21 is formed on a −X-side face of the chamber 20. The second opening 22 is formed on a +X-side face of the chamber 20. The first opening 21 and the second opening 22 are formed to have a size which allows the substrate S to pass through. The substrate S is placed in or taken out of the chamber 20 through the first opening 21 and the second opening 22.

The treatment room 20a is provided with an ejection part 31, a maintenance part 32, a liquid material supply part 33, a washing liquid supply part 34, a waste liquid storing part 35, a gas supply/exhaust part 37 and a substrate transporting part 25.

The ejection part 31 has a nozzle NZ, a treatment stage 28 and a nozzle actuator NA.

Figure 3:
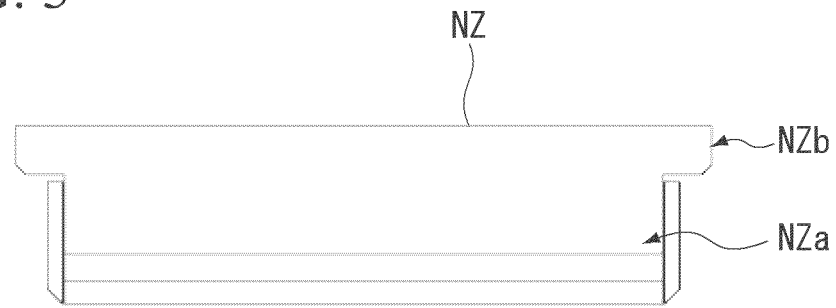
FIG. 3 is a diagram showing a configuration of a nozzle according to the present embodiment.
Figure 3:
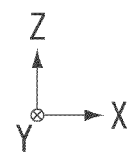

FIG. 3 is a diagram showing a configuration of the slit nozzle NZ.

As shown in FIG. 3, the nozzle NZ is formed to have an elongate shape, and is arranged such that the lengthwise direction thereof is in parallel to the X direction. The nozzle NZ has a main part NZa and a protruding part NZb. The main part NZa is a housing capable of accommodating the liquid material inside thereof. The main part NZa is made of, for example, a material containing titanium or a titanium alloy. The protruding part NZb is formed to protrude from the main part NZa on the +X-side and the −X-side. The protruding part NZb is held by part of the nozzle actuator NA.

Figure 4:
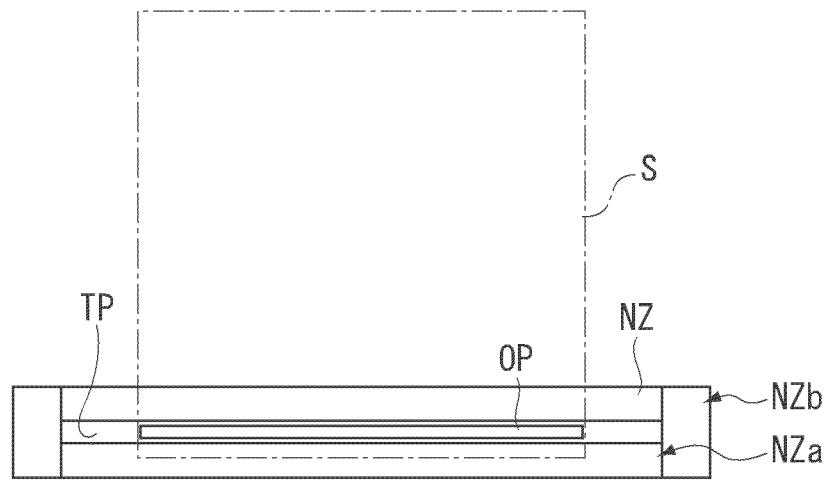
FIG. 4 is a diagram showing a configuration of a nozzle according to the present embodiment.
Figure 4:
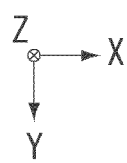

FIG. 4 shows the configuration when the nozzle NZ is viewed from the −Z direction side thereof.

As shown in FIG. 4, the nozzle NZ has an ejection opening OP on the −Z-side end (tip TP) of the main part NZa. The ejection opening OP is an opening for ejecting a liquid material. The ejection opening OP is formed as a slit elonging in the X direction. The ejection opening OP is formed, for example, so that the longitudinal direction thereof is substantially equal to the X-direction dimension of the substrate S.

The nozzle NZ ejects, for example, a liquid material in which four types of metals, namely, Cu, In, Ga, and Se are mixed with a predetermined composition ratio. The nozzle NZ is connected to a liquid supply part 33 via a connection pipe or the like (not shown). The nozzle NZ includes a holding part which holds the liquid material therein. A temperature control part which controls the temperature of the liquid material held by the holding part may be provided.

Figure 2:
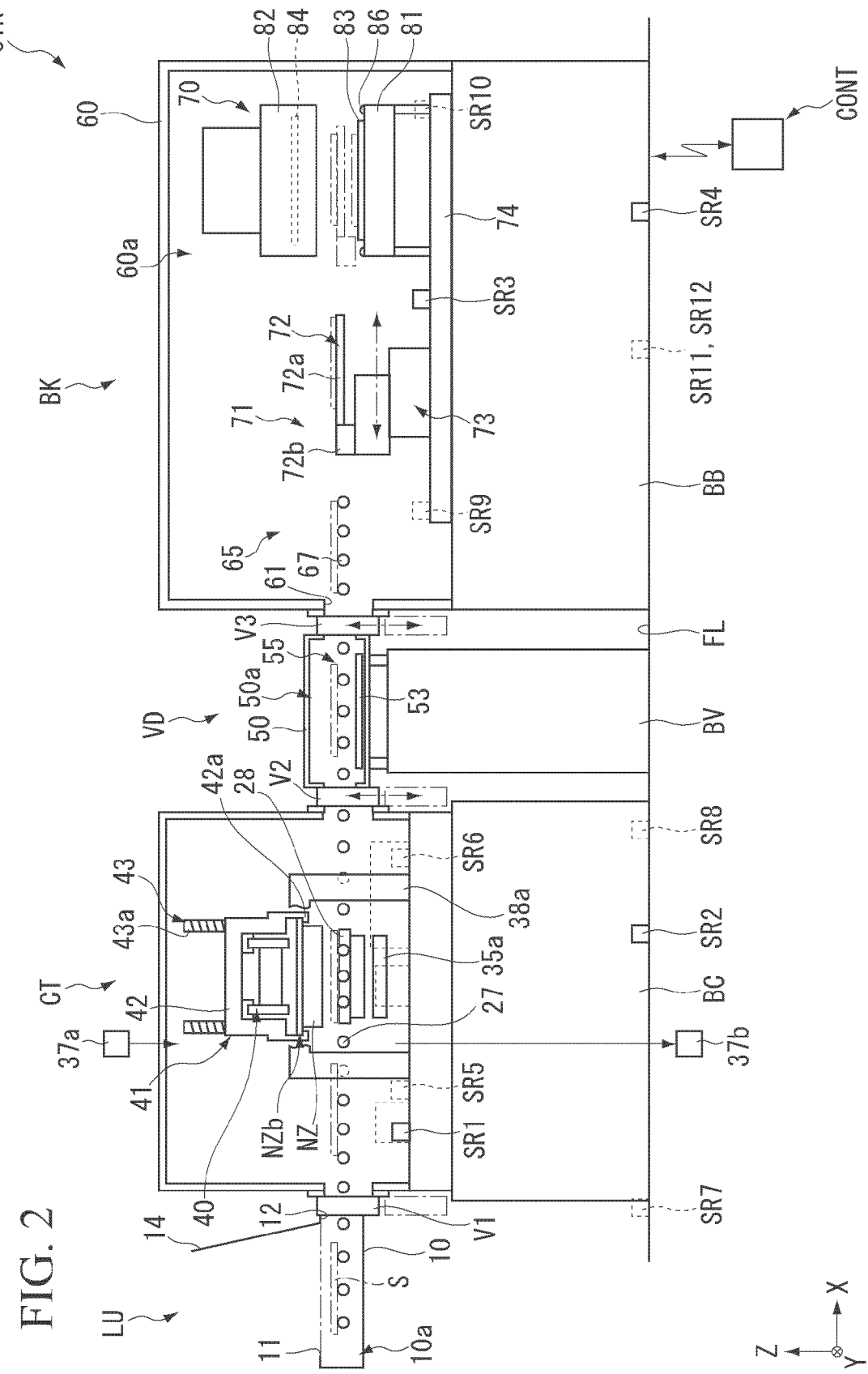
FIG. 2 is a diagram showing an entire configuration of a coating apparatus according to the present embodiment.

Returning to FIG. 1 and FIG. 2, the substrate S to be subjected to a coating treatment is mounted on the treatment stage 28. The +Z-side face of the treatment stage 28 is a substrate mounting face where the substrate S is mounted. The substrate mounting face is formed to be in parallel with the XY plane. The treatment stage 28 is made of, for example, stainless steel.

The nozzle actuator NA moves the nozzle NZ in the X direction. The nozzle actuator NA has a stator 40 and a mover 41 which constitutes a linear motor mechanism. As the nozzle actuator NA, any other actuator having another configuration such as a ball screw configuration may be used. The stator 40 is elongated in the Y direction. The stator 40 is supported by a support frame 38. The support frame 38 has a first frame 38a and a second frame 38b. The first frame 38a is provided on a −Y-side end portion of the treatment room 20a. The second frame 38b is provided in the treatment room 20a such that the treatment stage 28 is positioned between the first frame 38a and the second frame 38b.

The mover 41 is movable along the direction where the stator 40 is elonged (Y direction). The mover 41 has a nozzle supporting member 42 and an elevator part 43. The nozzle supporting member 42 is formed in the shape of a gate, and has a holding part 42a which holds the protruding part NZb of the nozzle NZ. The nozzle supporting member 42 integrally moves with the elevator part 43 along the stator 40 between the first frame 38a and the second 38b in the Y direction. Thus, the nozzle NZ held by the nozzle supporting member 42 moves in the Y direction over the treatment stage 28. The nozzle supporting member 42 moves along the elevation guide 43a of the elevator part 43 in the Z direction. The mover 41 has an actuator source (not shown) which moves the nozzle supporting member 42 in the Y direction and the Z direction.

The maintenance part 32 is where the maintenance of the nozzle NZ is performed. The maintenance part 32 has a nozzle standby part 44 and a nozzle-tip control part 45.

The nozzle standby part 44 has a dipping part (not shown) where the tip TP of the nozzle NZ is dipped to prevent it from drying, and a discharge part (not shown) which discharges the liquid material held within the nozzle NZ when the nozzle NZ is changed or the liquid material to be supplied to the nozzle NZ is changed.

The nozzle-tip control part 45 adjusts the conditions of the nozzle tip by washing the tip TP of the nozzle NZ and the vicinity thereof, and conducting preliminary ejection from the ejection opening OP of the nozzle NZ. The nozzle-tip control part 45 has a wiping part 45a which wipes the tip TP of the nozzle NZ and a guide rail 45b which guides the wiping part 45a. The nozzle-tip control part 45 is provided with a waste liquid accommodation part 35a which accommodates the liquid material discharged from the nozzle NZ and the washing liquid used for washing the nozzle NZ.

Figure 5:
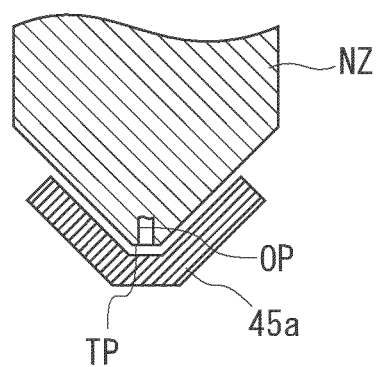
FIG. 5 is a diagram showing a configuration of part of a coating apparatus according to the present embodiment.

FIG. 5 is a diagram showing the cross-sectional shape of the nozzle NZ and the nozzle-tip control part 45. As shown in FIG. 5, the wiping part 45a is formed to cover the tip TP of the nozzle NZ and part of the inclined plane on the tip TP-side in the cross-sectional view.

The guide rail 45b extends in the X direction to cover the opening OP of the nozzle NZ. The wiping part 45a is adapted to be movable by an actuator source (not shown) along the guide rail 45b in the X direction. By moving the wiping part 45a in the X direction while being in contact with the tip TP of the nozzle NZ, the tip TP can be wiped.

The liquid material supply part 33 has a first liquid material accommodation part 33a and a second liquid material accommodation part 33b. The first liquid material accommodation part 33a and the second liquid material accommodation part 33b accommodate the liquid material to be applied to the substrate S. Further, the first liquid material accommodation part 33a and the second liquid material accommodation part 33b are capable of accommodating a plurality of different types of liquid materials.

The washing liquid supply part 34 accommodates a washing liquid which washes various parts of the coating part, such as the inside of the nozzle NZ and the nozzle-tip control part 45. The washing liquid supply part 34 is connected to the inside of the nozzle NZ and the nozzle-tip control part 45 via a pipe and a pump (which are not shown).

The waste liquid storing part 35 collects the liquid ejected from the nozzle NZ and is not reused. The nozzle-tip control part 45 may have a configuration in which the part which conducts the preliminary ejection and the part which washes the tip TP of the nozzle NZ are individually provided. Alternatively, the preliminary ejection may be conducted at the nozzle standby part 44.

The gas supply/exhaust part 37 has a gas supply part 37a and a gas exhaust part 37b. The gas supply part 37a supplies an inert gas such as a nitrogen gas or an argon gas to the treatment room 20a. The gas exhaust part 37b suctions the treatment room 20a, and discharges the gas in the treatment room 20a outside the chamber 20.

The substrate transporting part 25 transports the substrate S inside the treatment room 20a. The substrate transporting part 25 includes a plurality of rollers 27. The rollers 27 are arranged in the X-direction to be intersected into two lines by a central portion of the treatment room 20a in the Y-direction. The rollers 27 arranged in each line support the +Y-side end and −Y-side end of the substrate S.

By rotating each of the rollers 27 clockwise or anti-clockwise around the Y-axis in a state where the substrate S is supported by the plurality of rollers 27, the substrate S supported by each of the rollers 27 is transported in an X-direction (+X-direction or −X-direction). A float transporting part (not shown) may be used to lift the substrate for transportation.

(Vacuum Drying Part)

The vacuum drying part VD dries the liquid material coated on the substrate S. The vacuum drying part VD has a chamber 50, a base BV and gate valves V2 and V3. The vacuum drying part VD has a configuration in which the chamber 50 is mounted on the base BV placed on the floor FL.

The chamber 50 is formed in the shape of a rectangular box. Inside the chamber 50, a treatment room 50a is formed. The chamber 50 has a first opening 51 and a second opening 52. The first opening 51 and the second opening 52 communicates the treatment room 50a with the outside of the chamber 50.

The first opening 51 is formed on a −X-side face of the chamber 50. The second opening 52 is formed on a +X-side face of the chamber 50. The first opening 51 and the second opening 52 are formed to have a size which allows the substrate S to pass through. The substrate S is placed in or taken out of the chamber 50 through the first opening 51 and the second opening 52.

The treatment room 50a is provided with a substrate transporting part 55, a gas supply part 58, a gas exhaust part 59 and a heating part 53.

The substrate transporting part 55 includes a plurality of rollers 57. The rollers 57 are arranged in a pair in the Y-direction, and a plurality of the pairs are arranged in the X-direction. The plurality of rollers 57 supports the substrate S which is disposed in the treatment room 50a via the first opening 51.

By rotating each of the rollers 57 clockwise or anti-clockwise around the Y-axis in a state where the substrate S is supported by the plurality of rollers 57, the substrate S supported by each of the rollers 57 is transported in an X-direction (+X-direction or −X-direction). A float transporting part (not shown) may be used to lift the substrate for transportation.

Figure 6:
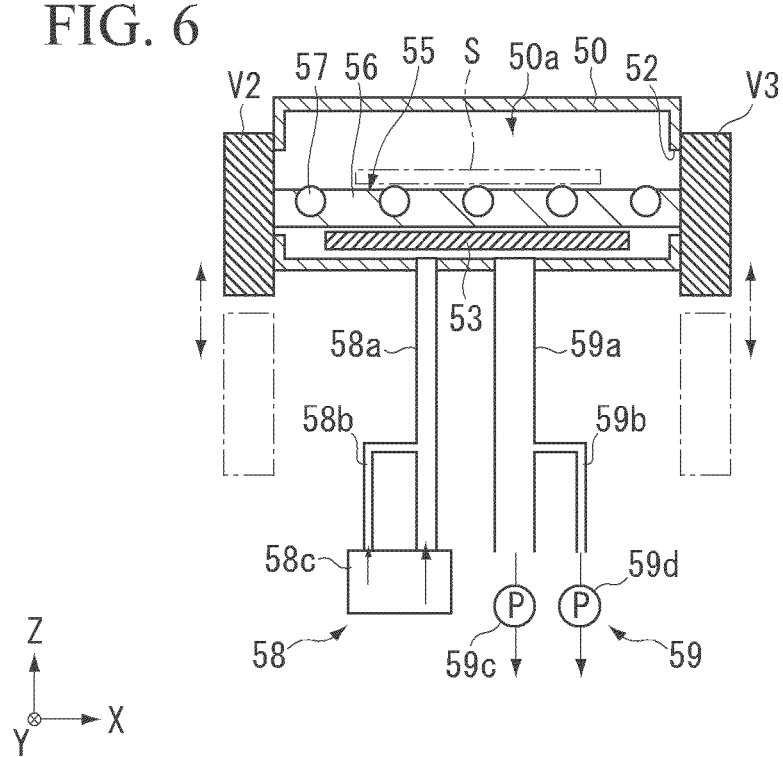
FIG. 6 is a diagram showing a configuration of a vacuum drying part according to the present embodiment.

FIG. 6 is a schematic diagram showing a configuration of the vacuum drying part VD.

As shown in FIG. 6, the gas supply part 58 supplies an inert gas such as a nitrogen gas or an argon gas to the treatment room 50a. The gas supply part 58 has a first supply part 58a and a second supply part 58b. The first supply part 58a and the second supply part 58b are connected to a gas supply source 58c such as a gas bomb or a gas pipe. Supplying of a gas to the treatment room 50a is performed mainly by using the first supply part 58a. The second supply part 58b makes a fine control of the amount of gas supplied by the first supply part 58a.

The gas exhaust part 59 suctions the treatment room 50a, and discharges the gas in the treatment room 50a outside the chamber 50, thereby reducing the pressure inside the treatment room 50a. By reducing the pressure inside the treatment room 50a, evaporation of the solvent contained in the liquid material on the substrate S can be promoted, thereby drying the liquid material. The gas exhaust part 59 has a first suction part 59a and a second suction part 59b. The first suction part 59a and the second suction part 59b are connected to a suction source 59c and 59d such as a pump. Suction from the treatment room 50a is performed mainly by using the first suction part 59a. The second suction part 59b makes a fine control of the amount of suction by the first suction part 59a.

The heating part 53 heats the liquid material on the substrate S disposed in the treatment room 50a. As the heating part 53, an infrared device or a hot plate is used. The temperature of the heating part 53 can be controlled, for example, from room temperature to about 100° C. By using the heating part 53, evaporation of the solvent contained in the liquid material on the substrate S can be promoted, thereby supporting the drying treatment under reduced pressure.

(Baking Part)

The baking part BK bakes the coating film coated on the substrate S. The baking part BK includes a chamber 60 and a base BB. The baking part BK has a configuration in which chamber 60 is mounted on the base BB placed on the floor FL.

The chamber 60 is formed in the shape of a rectangular box. Inside the chamber 60, a treatment room 60a is formed. The chamber 60 has an opening 61. The opening 61 communicates the treatment room 60a with the outside of the chamber 60. The first opening 61 is formed on a −X-side face of the chamber 60. The opening 61 is formed to have a size which allows the substrate S to pass through. The substrate S is placed in or taken out of the chamber 60 through the opening 61.

The treatment room 60a is provided with a substrate transporting part 65, a gas supply part 68, a gas exhaust part 69 and a heating part 70.

The substrate transporting part 65 has a plurality of rollers 67 and an arm part 71. The rollers 67 are arranged in a pair in the Y-direction on the substrate guide stage 66, and a plurality of the pairs are arranged in the X-direction. The plurality of rollers 67 supports the substrate S which is disposed in the treatment room 60a via the opening 61.

By rotating each of the rollers 67 clockwise or anti-clockwise around the Y-axis in a state where the substrate S is supported by the plurality of rollers 67, the substrate S supported by each of the rollers 67 is transported in an X-direction (+X-direction or −X-direction). A float transporting part (not shown) may be used to lift the substrate for transportation.

The arm part 71 is disposed on a platform 74, and transfers the substrate S between the plurality of rollers 67 and the heating part 70. The arm part 71 has a transport arm 72 and an arm actuator 73. The transport arm 72 has a substrate supporting part 72a and a moving part 72b. The substrate supporting part 72a supports the +Y-side edge and −Y-side edge of the substrate S. The moving part 72b is attached to the substrate supporting part 72a, and is movable in the X-direction and the θZ-direction.

The arm actuator 73 actuates the moving part 72b in the X-direction or the θZ-direction. When the moving part 72b is moved in the +X-direction by the arm actuator 73, the substrate supporting part 72a is inserted inside the heating part 70, and the substrate S is placed at a central portion of the heating part 70 as viewed in the Z-direction.

Figure 7:
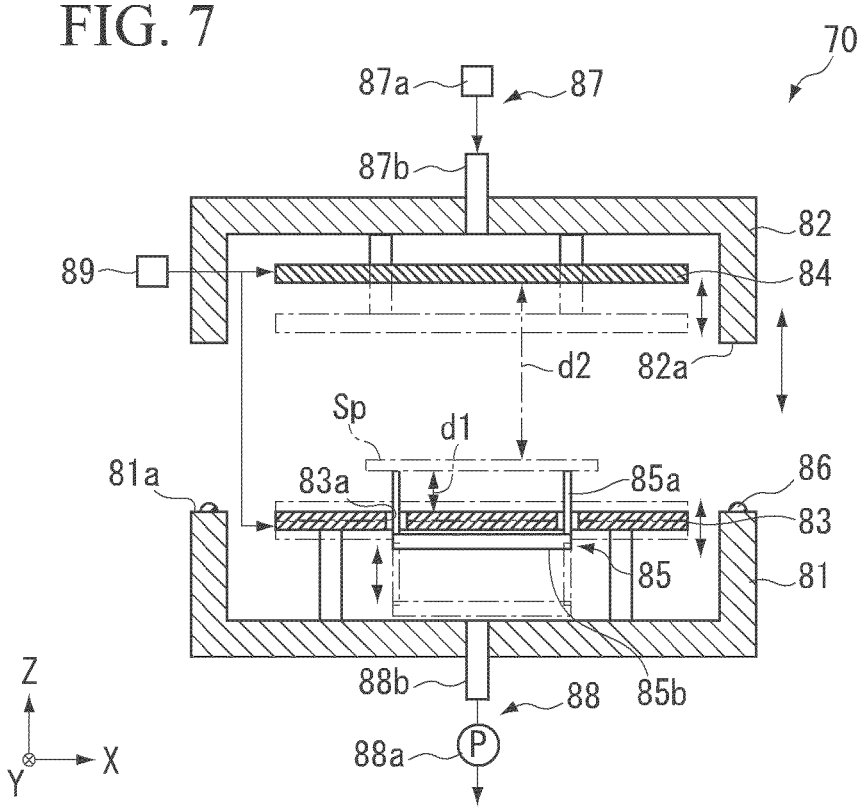
FIG. 7 is a diagram showing a configuration of part of a baking part according to the present embodiment.

FIG. 7 is a cross-sectional view showing the configuration of the heating part 70.

As shown in FIG. 7, the heating part 70 is disposed on the platform 74, and has a first accommodation part 81, a second accommodation part 82, a first heating plate 83, a second heating plate 84, a lifting part 85, a sealing part 86, a gas supply part 87, an exhaust part 88 and a distance control part 89.

The first accommodation part 81 is formed in the shape of a rectangular open box as viewed in the Z-direction, and is mounted on the bottom of the chamber 60 such that the opening faces the +Z side. The second accommodation part 82 is formed in the shape of a rectangular open box as viewed in the Z-direction, and is disposed such that the opening faces the first accommodation part 81. The second accommodation part 82 is movable in the Z direction by using a lifting mechanism (not shown). By superimposing the edge portion 82a of the second accommodation part 82 on the edge 81a of the first accommodation part 81, the inside of the first accommodation part 81 and the second accommodation part 82 is closed.

The first heating plate 83 is accommodated in the first accommodation part 81. The first heating part 83 heats a substrate S in a state where the substrate S is mounted on the first heating part 83. The first heating plate 83 is formed of, for example, quartz or the like, and is provided with a heating device such as an infrared device or a hot plate inside thereof. The temperature of the first heating plate 83 is adjustable, for example, from about 200 to 800° C. The first heating part 83 has a plurality of through-holes 83a formed thereon. The through-holes 83a allow part of the lifting part 85 to penetrate therethrough.

The second heating plate 84 is accommodated in the second accommodation part 82. The second heating plate 84 is formed of, for example, a metal material, and is provided with a heating device such as an infrared device or a hot plate inside thereof. The temperature of the second heating plate 84 is adjustable, for example, from about 200 to 800° C.

The first heating plate 83 and the second heating plate 84 are disposed to be in parallel with the XY plane. Further, the first heating plate 83 and the second heating plate 84 may be arranged to be aligned in the Z direction (vertical direction) so as to sandwich the substrate position Sp where the substrate S having the coating film F formed thereon is disposed in the Z direction (the film thickness direction of the coating film F).

The lifting part 85 moves the substrate S between the arm part 71 and the first heating plate 83. The lifting part 85 has a plurality of support pins 85a and a moving part 85b which is movable in the Z direction while holding the support pins 85a. For easier discrimination of the drawings, in FIG. 7, a configuration is shown in which two support pins 85a are provided. However, in practice, it is possible to provide, for example, sixteen support pins 85a (see FIG. 7). The plurality of through-holes 83a provided on the first heating plate 83 are arranged at positions corresponding to the plurality of support pins 85a as viewed in the Z direction.

The sealing part 86 is formed on the edge portion 81a of the first accommodation part 81. As the sealing part 86, for example, an O-ring formed by a resin material or the like can be used. The sealing part 86 seals the first accommodation part 81 and the second accommodation part 82 in a state where the edge portion 82a of the second accommodation part 82 is superimposed on the first edge 81a of the first accommodation part 81. In this manner, the inside of the first accommodation part 81 and the second accommodation part 82 can be closed.

The gas supply part 87 supplies a hydrogen gas, an argon gas, a nitrogen gas or the like to the treatment room 60a. The gas supply part 87 is connected to the +Z-side face of the chamber 60. The gas supply part 87 has a gas supply source 87a such as a gas bomb or a gas pipe, and a connection pipe 87b which connects the gas supply source 87a with the chamber 60.

The exhaust part 88 suctions the treatment room 60a, and discharges the gas in the treatment room 80a outside the chamber 60. The exhaust part 88 is connected to the −Z-side face of the chamber 60. The exhaust part 88 has a suction source 88a such as a pump, and a connection pipe 88b which connects the suction source 88a with the chamber 60.

The distance control part 89 is a moving mechanism which independently moves the first heating plate 83 and the second heating plate 84 in the Z direction. As the distance control part 89, for example, a motor mechanism, an air cylinder or the like is used. By moving the first heating plate 83 and the second heating plate 84 in the Z direction, the distance control part 89 can control a first distance d1 between the first heating plate 83 and the substrate S, and a second distance d2 between the second heating plate 84 and the substrate S.

Further, in the present embodiment, solvent concentration sensors SR3 and SR4 are provided. Like the aforementioned solvent concentration sensors SR1 and SR2, the solvent concentration sensors SR3 and SR4 detects the concentration of the solvent (in the present embodiment, hydrazine) for the liquid material in the ambient atmosphere, and sends the detection results to the control part CONT. The solvent concentration sensor SR3 is provided on the platform 74 on the +Y side of the heating part 70 within the treatment room 60a. The solvent concentration sensor SR3 is provided at a position remote from the heating part 70. The solvent concentration sensor SR4 is provided outside the chamber 60. In the present embodiment, for detecting the concentration of hydrazine which has a larger specific gravity than air, like the solvent concentration sensors SR1 and SR2, the solvent concentration sensors SR3 and SR4 are disposed on the lower side of the transport path of the substrate S in the vertical direction. Further, by providing a solvent concentration sensor SR4 outside the chamber 60, it becomes possible to detect leakage of hydrazine from the chamber 60.

(Substrate Transport Path)

The second opening 12 of the substrate loading/unloading part LU, the first opening 21 and the second opening 22 of the coating part CT, the first opening 51 and the second opening 52 of the vacuum drying part VD and the opening 61 of the baking part BK are provided along a line in parallel to the X-direction. Thus, the substrate S is moved along a line in the X-direction. Further, in the path from the substrate loading/unloading part LU to the heating part 70 of the baking part BK, the position in the Z-direction is maintained. Thus, stirring of the gas around the substrate S can be suppressed.

(Anti-Chamber)

As shown in FIG. 1, the chamber 20 has anti-chambers AL1 to AL3 connected thereto.

The anti-chambers AL1 to AL3 are provided to communicate with the inside and outside of the chamber 20. Each of the anti-chambers AL1 to AL3 is a path through which a component of the treatment room 20a is taken out of the chamber 20 or the component is placed into the treatment room 20a from outside the chamber 20.

The anti-chamber AL1 is connected to the ejection part 31. The nozzle NZ provided in the ejection part 31 can be taken out of or placed into the treatment room 20a via the anti-chamber AL1. The anti-chamber AL2 is connected to the liquid material supply part 33. The liquid material supply part 33 can be taken out of or placed into the treatment room 20a via the anti-chamber AL2.

The anti-chamber AL3 is connected to a liquid material preparation part 36. In the liquid material preparation part 36, a liquid can be taken out of or placed into the treatment room 20a via the anti-chamber AL3. The anti-chamber AL3 is formed to have a size which allows the substrate S to pass through. Therefore, for example, when a test coating of the liquid material is to be conducted in the coating part CT, a substrate S prior to treatment can be supplied to the treatment room 20a from the anti-chamber AL3. Further, the substrate S after the test coating can be taken out from the anti-chamber AL3. Moreover, the substrate S can be taken out from the anti-chamber AL3 temporarily in emergency.

The chamber 60 has an anti-chamber AL4 connected thereto.

The anti-chamber AL4 is connected to the heating part 70. The anti-chamber AL4 is formed to have a size which allows the substrate S to pass through. Therefore, for example, when heating of the substrate S is to be conducted in the heating part 70, the substrate S can be supplied to the treatment room 60a from the anti-chamber AL4. Further, the substrate S after the heat treatment can be taken out from the anti-chamber AL4.

(Glove Part)

As shown in FIG. 1, the chamber 20 has a glove part GX1 connected thereto. Further, the chamber 60 has a glove part GX2 connected thereto.

The glove parts GX1 and GX2 are parts where an operator accesses the inside of the chamber 20 and the chamber 60. By inserting the hands inside the glove parts GX1 and GX2, the operator can conduct maintenance inside the chamber 20 and the chamber 60. The glove parts GX1 and GX2 are formed to have a bag-like shape. The glove parts GX1 and GX2 are respectively provided at a plurality of portions on the chamber 20 and the chamber 60. A sensor may be provided inside the chamber 20 and the chamber 60 which detects whether or not an operator has put his hand in the glove part GX1 or GX2.

(Gate Valve)

Between the second opening 12 of the substrate loading/unloading part LU and the first opening 21 of the coating part CT, a gate valve V1 is provided. The gate valve V1 is provided to be movable in the Z-direction by an actuator (not shown). By moving the gate valve V1 in the Z-direction, the second opening 12 of the substrate loading/unloading part LU and the first opening 21 of the coating part CT are simultaneously opened or closed. When the second opening 12 and the first opening 21 are simultaneously opened, a substrate S can be moved through the second opening 12 and the first opening 21.

Between the second opening 22 of the coating part CT and the first opening 51 of the vacuum drying part VD, a gate valve V2 is provided. The gate valve V2 is provided to be movable in the Z-direction by an actuator (not shown). By moving the gate valve V2 in the Z-direction, the second opening 22 of the coating part CT and the first opening 51 of the vacuum drying part VD are simultaneously opened or closed. When the second opening 22 and the first opening 51 are simultaneously opened, a substrate S can be moved through the second opening 22 and the first opening 51.

Between the second opening 52 of the vacuum drying part VD and the opening 61 of the baking part BK, a gate valve V3 is provided. The gate valve V3 is provided to be movable in the Z-direction by an actuator (not shown). By moving the gate valve V3 in the Z-direction, the second opening 52 of the vacuum drying part VD and the opening 61 of the baking part BK are simultaneously opened or closed. When the second opening 52 and the opening 61 are simultaneously opened, a substrate S can be moved through the second opening 52 and the opening 61.

(Control Device)

The control part CONT is a part which has the overall control of the coating apparatus CTR. Specifically, the control part CONT controls the operations of the substrate loading/unloading part LU, the coating part CT, the vacuum drying part VD, the baking part BK and the gate valves V1 to V3. For example, in the baking part BK, the control part CONT controls the first distance d1 between the first heating plate 83 and the substrate S, and the second distance d2 between the second heating plate 84 and the substrate S. Further, for example, the control part CONT controls the amount of gas to be supplied from the gas supply part 37a, based on the detection results of the solvent concentration sensors SR1 to SR4. The control part CONT has a timer or the like (not shown) for measuring the treatment time.

(Coating Method)

Next, a coating method according to one embodiment of the present invention will be described. In this embodiment, a coating film is formed on the substrate S by using the coating apparatus CTR having the above-described configuration. The operations performed by the respective parts of the coating apparatus CTR are controlled by the control part CONT.

Firstly, the control part CONT loads a substrate S on the substrate loading/unloading part LU from the outside. In this case, the control part CONT closes the gate valve V1, opens the lid portion 14 and accommodates the substrate S in the accommodation room 10a of the chamber 10. After the substrate S is accommodated in the accommodation room 10a, the control part CONT closes the lid portion 14.

After the lid portion 14 is closed, the control part CONT opens the gate valve V1, so as to communicate the accommodation room 10a of the chamber 10 with the treatment room 20a of the chamber 20 of the coating part CT. After opening the gate valve V1, the control part CONT transports the substrate S in the X-direction using the substrate transporting part 15.

After a portion of the substrate S has been inserted into the treatment room 20a of the coating part CT, the control part CONT uses the substrate transporting part 25 to completely load the substrate S into the treatment room 20a. After the substrate S has been loaded, the control part CONT closes the gate valve V1. After closing the gate valve V1, the control part CONT transports the substrate S to the treatment stage 28.

Figure 8:
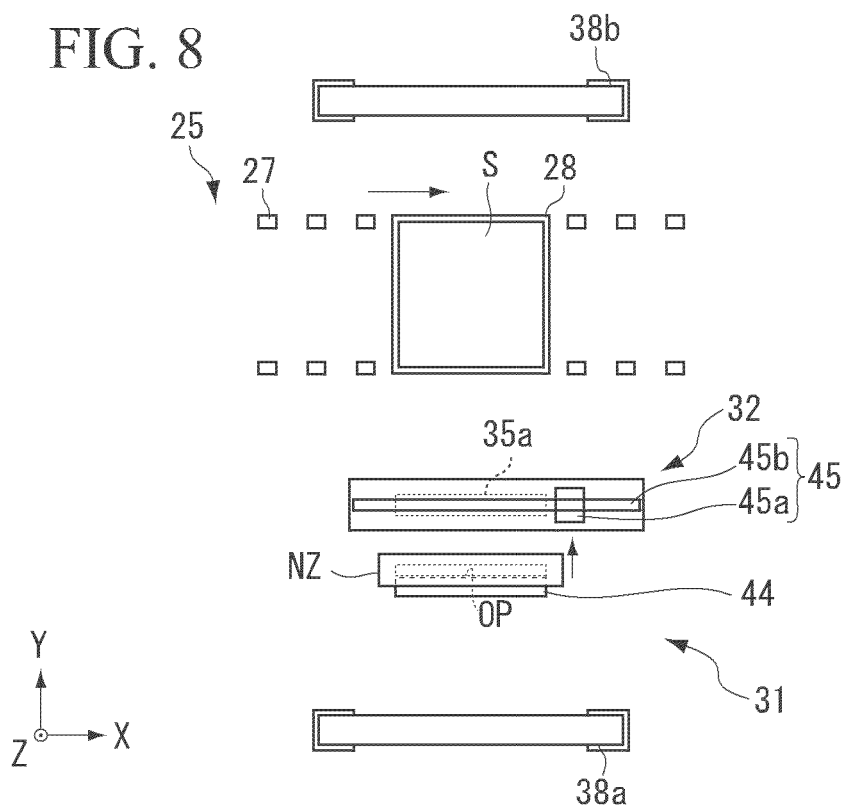
FIG. 8 is a diagram showing a step in a coating treatment performed by a coating apparatus according to the present embodiment.

FIG. 8 is a diagram showing a simplified configuration of the coating part CT in which part of the components have been abbreviated. Herebelow, the same applies to FIG. 9 to FIG. 12. As shown in FIG. 8, when the substrate S is mounted on the treatment stage 28, a coating treatment is conducted by the coating part CT. Prior to the coating treatment, the control part CONT closes the gate valves V1 and V2, and conducts supplying and suctioning of an inert gas using the gas supplying part 37a and the gas exhaust part 37b.

By this operation, the atmosphere and the pressure of the treatment room 20a can be adjusted. After adjusting the atmosphere and the pressure of the treatment room 20a, the control part CONT uses the nozzle actuator NA (not shown in FIG. 8) to move the nozzle NZ from the nozzle standby part 44 to the nozzle-tip control part 45. Thereafter, during the coating treatment, the control part CONT continuously conducts the adjusting operation of the atmosphere and the pressure of the treatment room 20a.

Figure 9:
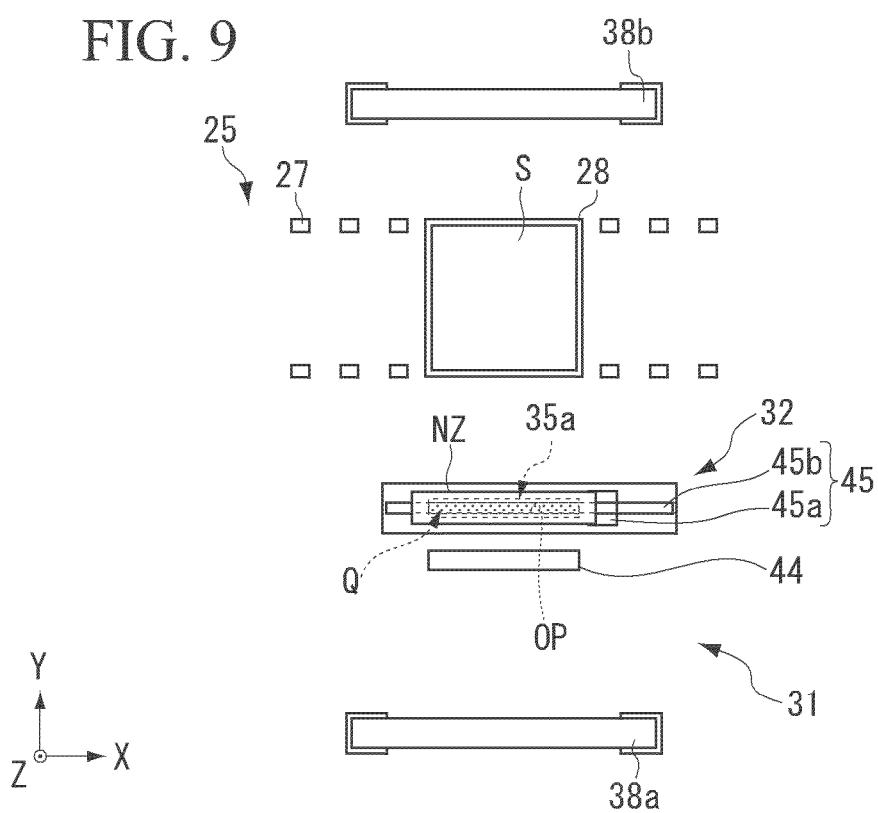
FIG. 9 is a diagram showing a step in a coating treatment performed by a coating apparatus according to the present embodiment.
Figure 10:
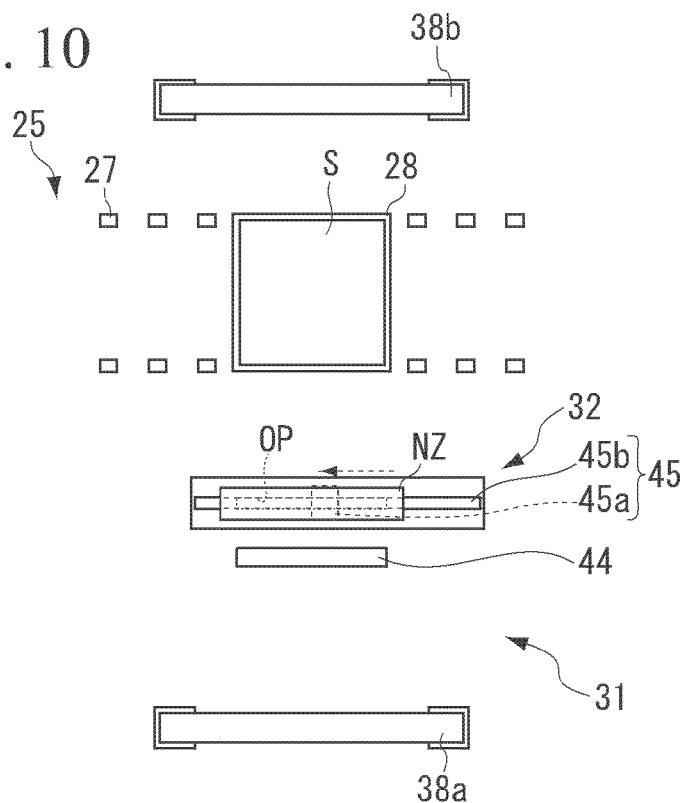
FIG. 10 is a diagram showing a step in a coating treatment performed by a coating apparatus according to the present embodiment.

When the nozzle NZ reaches the nozzle-tip control part 45, as shown in FIG. 9, the control part CONT conducts a preliminary ejection operation of the nozzle NZ. In the preliminary ejection operation, the control part CONT ejects the liquid material Q from the ejection opening OP. After the preliminary ejection operation, as shown in FIG. 10, the control part CONT moves the wiping part 45a along the guide rail 45b in the X-direction, so as to wipe the tip TP of the nozzle NZ and the inclined part in the vicinity thereof.

Figure 11:
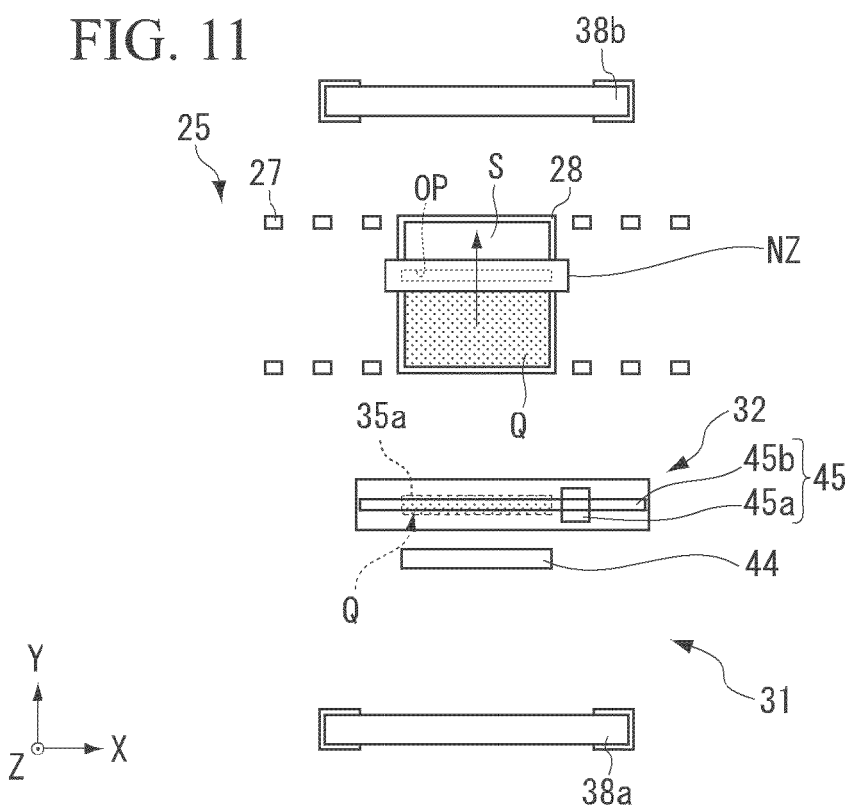
FIG. 11 is a diagram showing a step in a coating treatment performed by a coating apparatus according to the present embodiment.
Figure 12:
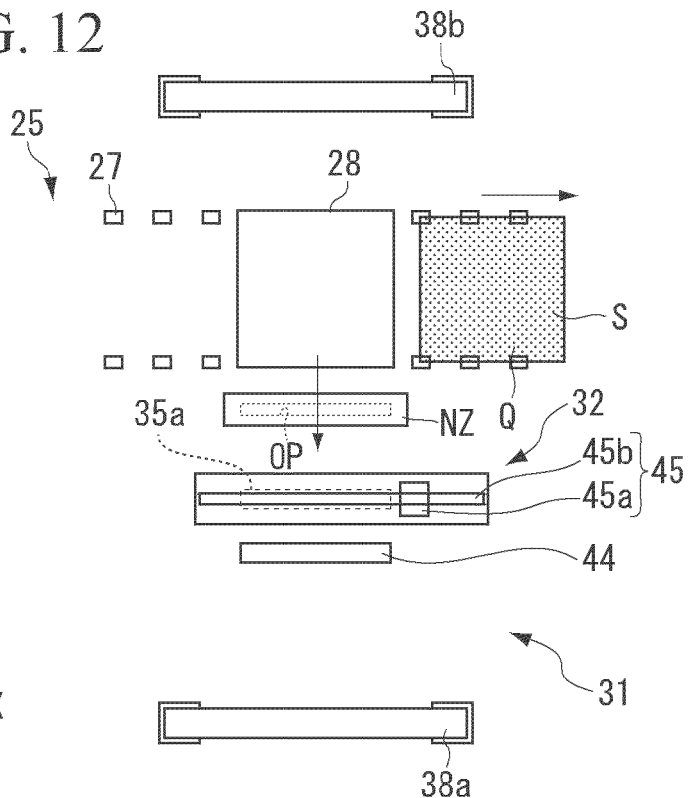
FIG. 12 is a diagram showing a step in a coating treatment performed by a coating apparatus according to the present embodiment.

After wiping the tip TP of the nozzle NZ, the control part CONT moves the nozzle NZ to the treatment stage 28. After the ejection opening OP of the nozzle NZ reaches the −Y-side end of the substrate S, as shown in FIG. 11, the control part CONT ejects the liquid material Q from the ejection opening OP to the substrate S while moving the nozzle NZ in the +Y-direction at a predetermined speed. By this operation, a coating film of the liquid material Q is formed on the substrate S.

After forming a coating film of the liquid material Q on a predetermined region of the substrate S, the control part CONT uses the substrate transporting part 25 to move the substrate S from the treatment stage 28 to the second stage 26B in the +X-direction. Further, the control part CONT moves the nozzle NZ in the −Y-direction, and returns the nozzle NZ to the nozzle standby part 44.

After the substrate S reaches the second opening 22 of the chamber 20, the control part CONT opens the gate valve V2, and transports the substrate S from the coating part CT to the vacuum drying part VD. After the substrate S is accommodated in the treatment room 50a of the chamber 50 provided in the vacuum drying part VD, the control part CONT closes the gate valve V2, and performs a vacuum drying treatment of the substrate S in the treatment room 50a.

Figure 13:
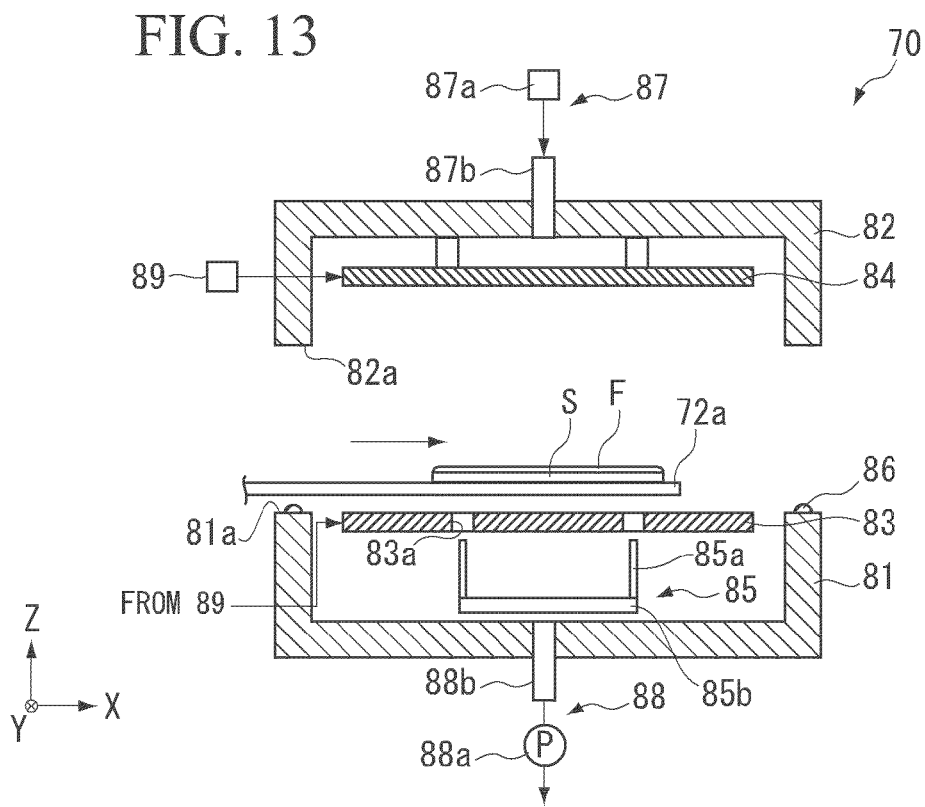
FIG. 13 is a diagram showing a step in a baking treatment performed by a coating apparatus according to the present embodiment.
Figure 14:
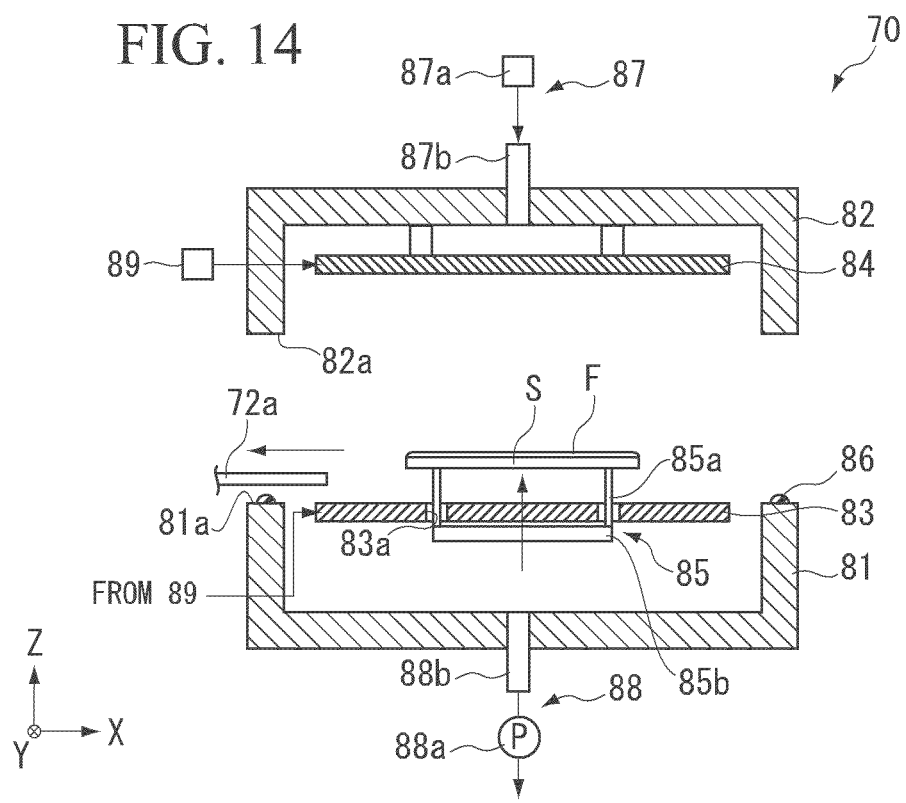
FIG. 14 is a diagram showing a step in a baking treatment performed by a coating apparatus according to the present embodiment.

After the vacuum drying treatment, the control part CONT uses the gas supply part 58 to adjust the atmosphere inside the treatment room 50a and uses the gas exhaust part 59 to reduce the pressure inside the treatment room 50a. When the pressure inside the treatment room 50a is reduced by this operation, evaporation of the solvent contained in the coating film of the liquid material Q formed on the substrate S is promoted, and the coating film is dried. The control part CONT may use the heating part 53, so as to promote evaporation of the solvent contained in the liquid material on the substrate S, thereby supporting the vacuum drying treatment. By this treatment, a coating film F is formed on the substrate S (see FIG. 13).

After the vacuum drying treatment, the control part CONT opens the gate valve V3, and transports the substrate S from the vacuum drying part VD to the baking part BK. After the substrate S is accommodated in the treatment room 60a of the chamber 60 provided in the baking part BK, the control part CONT closes the gate valve V3.

After the substrate S has been disposed at a central portion above the first heating plate 83 by the movement of the substrate supporting part 72a, the control part CONT moves the lifting part 85 in the +Z direction. By this operation, the substrate S leaves the substrate supporting part 72a of the transport arm 72, and is supported by the plurality of support pins 85a of the lifting part 85. In this manner, the substrate S is delivered from the substrate supporting part 72a to the lifting part 85. After the substrate S has been supported by the support pins 85a of the lifting part 85, the control part CONT withdraws the substrate supporting part 72a outside the heating part 70 in the −X direction.

Figure 15:
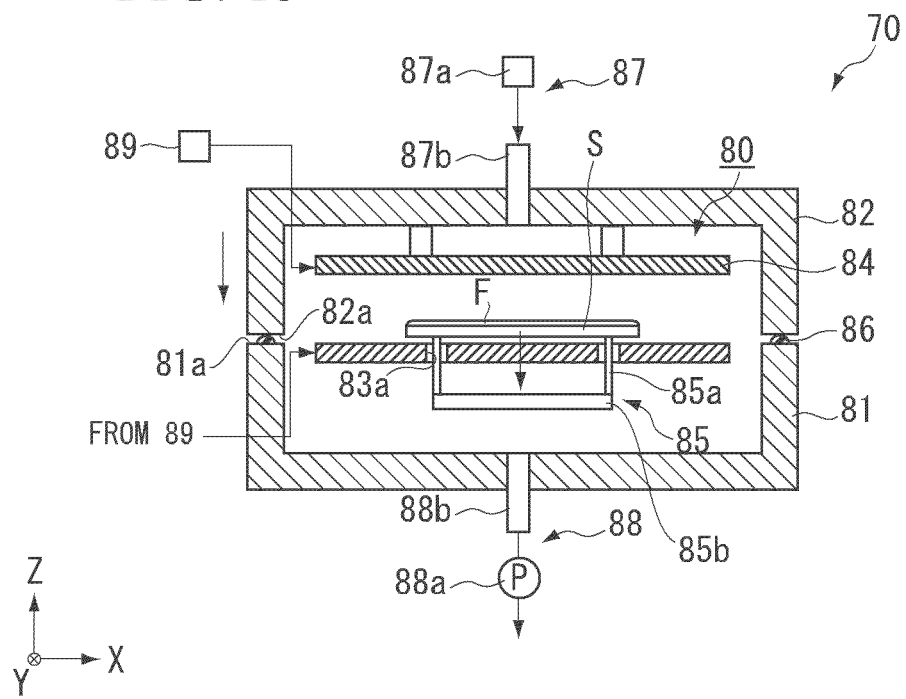
FIG. 15 is a diagram showing a step in a baking treatment performed by a coating apparatus according to the present embodiment.

After withdrawing the substrate supporting part 72a, as shown in FIG. 15, the control part CONT moves the lifting part 85 in the −Z direction, and also moves the second accommodation part 82 in the −Z direction. By this operation, the edge portion 82a of the second accommodation part 82 is superimposed on the edge 81a of the first accommodation part 81, so that the sealing part 86 is sandwiched between the edge portion 82a and the edge portion 81a. As a result, a closed baking room 80 is formed by the first accommodation part 81, the second accommodation part 82 and the sealing part 86.

Figure 16:
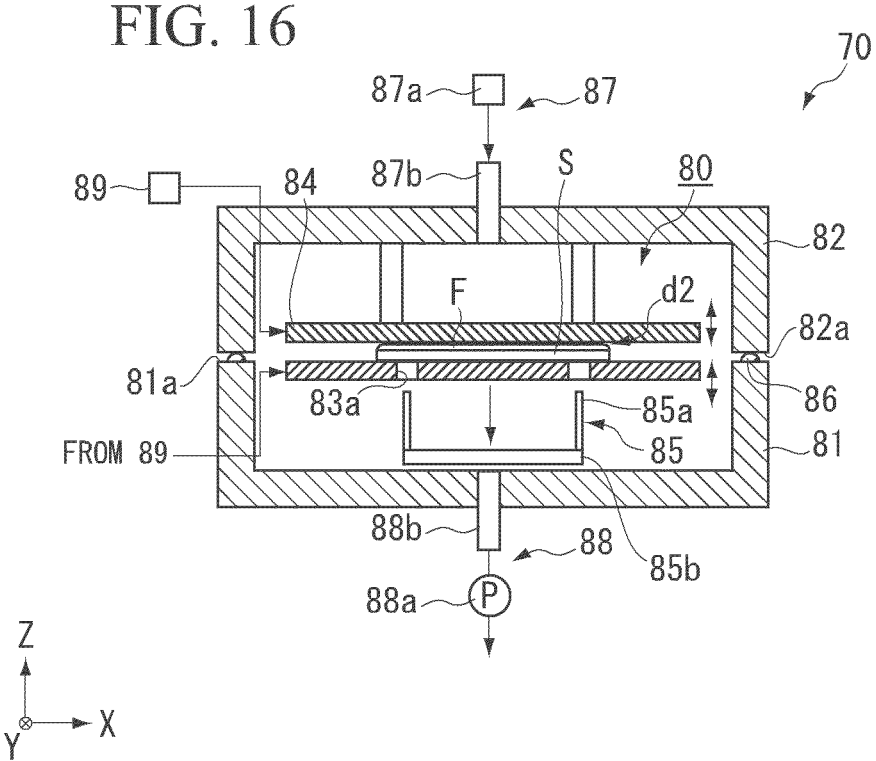
FIG. 16 is a diagram showing a step in a baking treatment performed by a coating apparatus according to the present embodiment.

After forming the baking room 80, as shown in FIG. 16, the control part CONT moves the lifting part 85 in the −Z direction and mounts the substrate S on the first heating plate 83. After the substrate S has been mounted on the first heating plate 83, the control part CONT moves the second heating plate 84 in the −Z direction, so that the second heating plate 84 approaches the substrate S. At this time, the control part CONT uses the distance control part 89 to control the positions of the first heating plate 83 and the second heating plate 84 in the Z direction.

In the present embodiment, since the substrate S is mounted on the first heating plate 83, the first distance d1 between the first heating plate 83 and the substrate S is maintained at 0. Thus, by the above control, the second distance d2 between the second heating plate 84 and the substrate S is adjusted.

Figure 17:
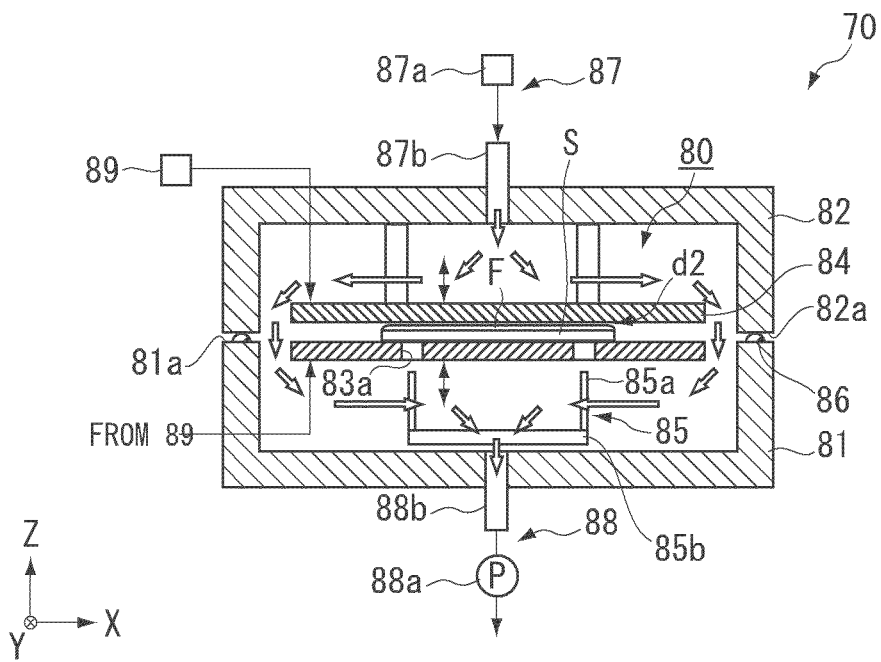
FIG. 17 is a diagram showing a step in a baking treatment performed by a coating apparatus according to the present embodiment.

After adjusting the position of the second heating plate 84 in the Z direction, as shown in FIG. 17, a nitrogen gas or a hydrogen sulfide gas is supplied to the baking room by using the gas supply part 87, and the baking room is suctioned by using the exhaust part 88. By this operation, not only the atmosphere and pressure inside the baking room 80 are adjusted, but also a stream of the nitrogen gas or the hydrogen sulfide gas is formed from the second accommodation part 82 to the first accommodation part 81.

In a state where the stream of the nitrogen gas or the hydrogen sulfide gas is formed, the control part CONT actuates the first heating plate 83 and the second heating plate 84, so as to perform the baking operation of the substrate S. By this operation, the solvent component evaporated from the coating film F and the like are swept away by the stream, and suctioned by the exhaust part 88. Further, since the gas stream of the nitrogen gas or the hydrogen sulfide gas is not directly jetted to the substrate S, but is supplied via the second heating plate 84, the influence on the shape of the coating film F can be prevented.

The control part CONT may use the distance control part 89 to control the position of the second heating plate 84 in the Z direction while performing the heating operation by the first heating plate 83 and the second heating plate 84. By this operation, the second distance d2 between the second heating plate 84 and the substrate S can be adjusted, and an optimal heating state for the coating film F can be formed. Further, since the distance between the first heating plate 83 and the gas exhaust part 88 and the distance between the second heating plate 84 and the gas supply part 87 are controlled, the gas stream of the nitrogen gas or the hydrogen sulfide gas can also be controlled.

After the baking operation has been completed, the control part CONT transports the substrate S in the −X direction. Specifically, the substrate S is unloaded from the baking part BK via the heating part 70, the arm part 71 and the substrate guide stage 66, and is returned to the substrate loading/unloading part LU via the coating part CT. After the substrate S has been returned to the substrate loading/unloading part LU, the control part CONT opens the lid portion 14 in a state where the gate valve V1 is closed. Thereafter, an operator collects the substrate S in the chamber 10, and accommodates a new substrate S in the accommodation room 10*a* of the chamber 10.

In the case where, after the substrate S has been returned to the substrate loading/unloading part LU, another coating film is formed to be superimposed on the coating film F formed on the substrate S, the control part CONT transports the substrate S to the coating part CT again, and repeats the coating treatment, the vacuum drying treatment and the baking treatment. In this manner, a coating film F is formed on the substrate S.

As described above, in the present embodiment, by virtue of being provided with a first heating plate 83 and a second heating plate 84 between which a substrate S having a coating film F is disposed at a substrate position Sp in the film thickness direction of the coating film F, and a distance control part 89 which controls a first distance d1 between the substrate position Sp and the first heating plate 83 and a second distance d2 between the substrate position Sp and the second heating plate 84, the heating conditions for the coating film F can be controlled. As a result, a coating film F having desired properties can be formed.

Further, in the present embodiment, by virtue of being provided with a coating part CT which forms a coating film F of a liquid material containing an oxidizable metal and a solvent on a substrate S, a baking part BK which heats the substrate S having the coating film F formed thereon, and transporting parts 55 and 65 and an arm part 71 which transport the substrate S between the coating part CT and the baking part BK, wherein the baking part BK has the above configuration capable of controlling the heating conditions of the coating film F, a coating film F having desired properties can be stably formed.

The technical scope of the present invention is not limited to the above-described embodiment, but may be appropriately modified into various forms without departing from the spirit of the present invention.

In the aforementioned embodiment, the coating part CT has a configuration which uses a slit-type nozzle NZ, but the present invention is not limited thereto. For example, a center-dripping-type coating part or an ink jet coating part may be used. Alternatively, for example, the liquid material disposed on the substrate S may be diffused by using a squeezer or the like so as to be coated thereon.

Further, in the aforementioned embodiment, when a configuration in which the coating apparatus CTR is accommodated in one room is employed, a gas supply/exhaust part which adjusts the atmosphere inside the room may be provided. In such a case, hydrazine present in the atmosphere inside the room may be discharged using the gas supply/exhaust part, thereby more reliably suppressing change in the coating environment.

Further, in the above embodiment, explanation was given taking example of a configuration in which the substrate S is disposed in parallel to the XY plane, and the first heating plate 83 and the second heating plate 84 are arranged to be vertically aligned to sandwich the substrate S in the Z direction. However, the present invention is not limited thereto.

Figure 18:
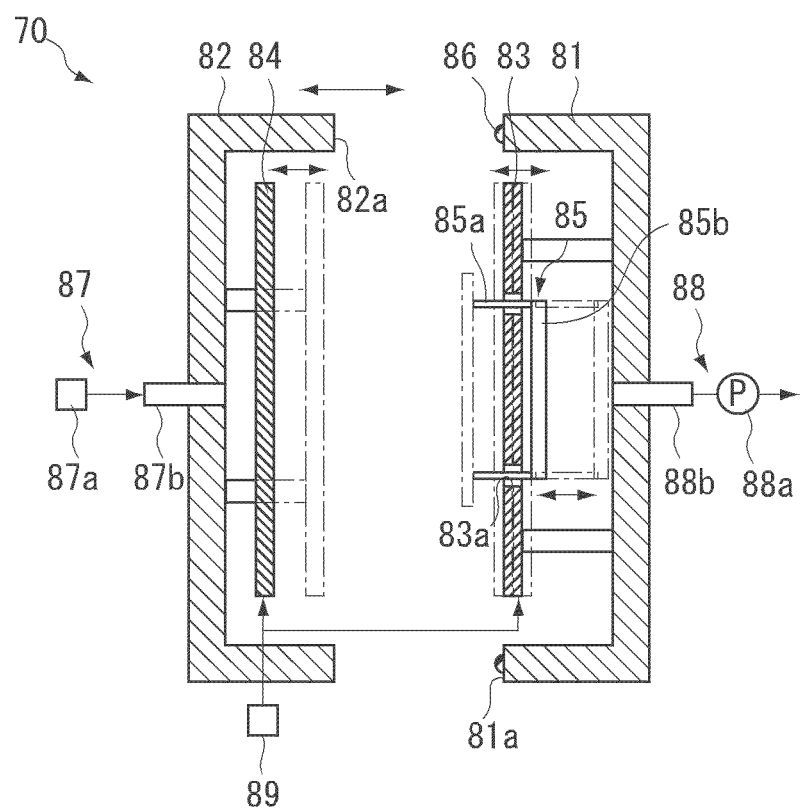
FIG. 18 is a diagram showing a configuration of a heating apparatus according to a modified example of the present invention.
Figure 18:
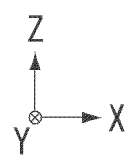

For example, as shown in FIG. 18, in the case where the substrate S is disposed in parallel to the YZ plane, a configuration in which the first heating plate 83 and the second heating plate 84 are arranged to be horizontally aligned to sandwich the substrate S in the X direction may be employed.

Further, in the above embodiment, explanation was given taking example of a mode in which, in the baking operation, heating is conducted in a state where the substrate S is mounted on the first heating plate 83. However, the present invention is not limited thereto.

Figure 19:
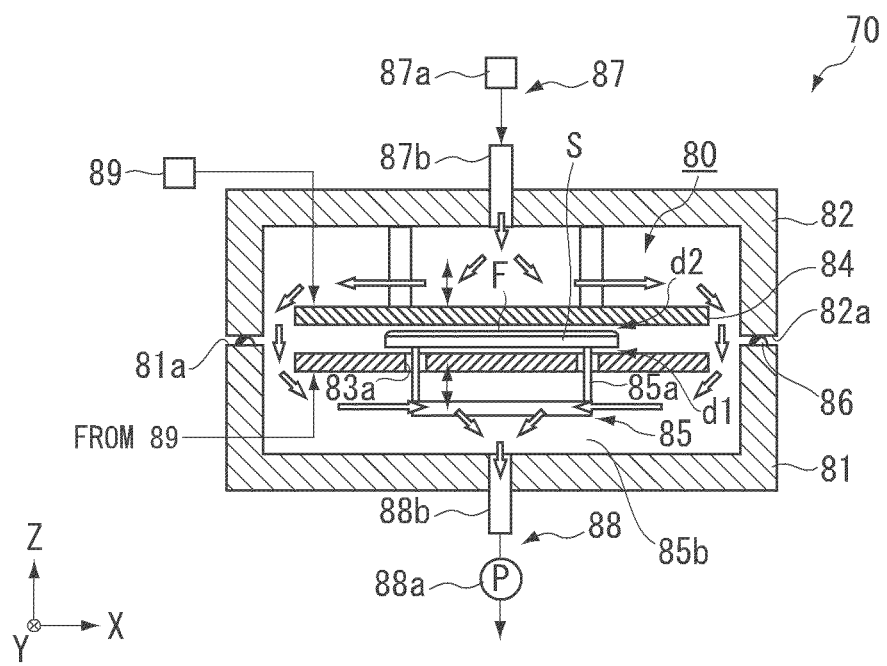
FIG. 19 is a diagram showing an operation of a heating apparatus according to a modified example of the present invention.

For example, as shown in FIG. 19, a configuration in which heating is conducted in a state where the substrate S is supported by a support pin 85*a* of a lifting part 85 may be employed. In such a case, both the first heating plate 83 and the second heating plate 84 can be moved in the Z direction, relative to the substrate S, so as to adjust both the first distance d1 and the second distance d2. As a result, an optimal heating state for the substrate S can be formed.

Further, in the aforementioned embodiment, explanation was given taking example of a configuration in which a gas is allowed to flow from an upper side (+Z side) of the substrate S in a vertical direction to a lower side thereof. However, the present invention is not limited thereto.

Figure 20:
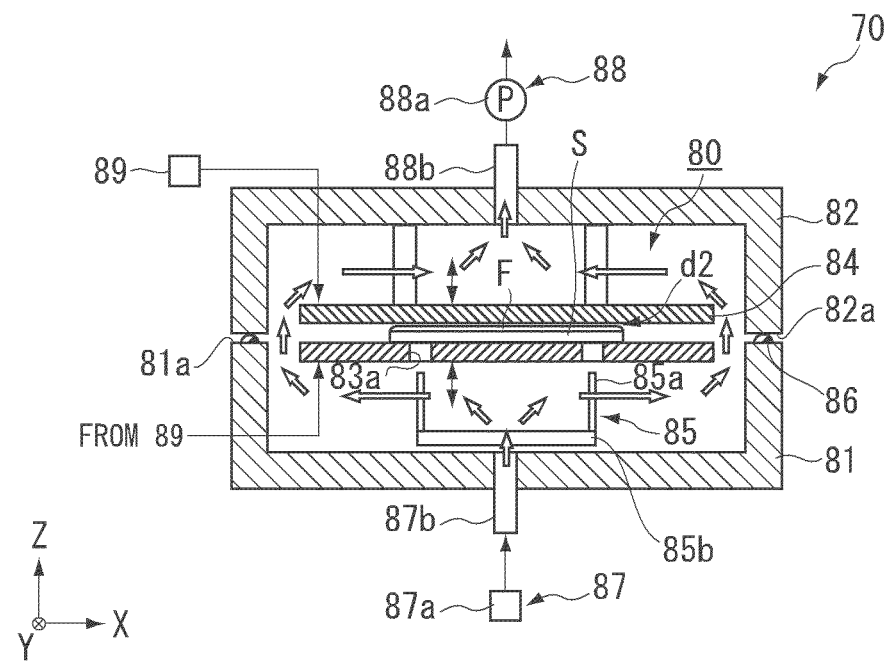
FIG. 20 is a diagram showing a configuration of a heating apparatus according to a modified example of the present invention.

For example, as shown in FIG. 20, a configuration may be employed in which a gas supply part 87 is provided on the first accommodation part 81, and a gas exhaust part 88 is provided on the second accommodation part 82. In such a case, as the gas to be supplied from the gas supply part 87, a hydrogen gas or the like which is lighter than air is preferable.

Further, in the aforementioned embodiment, explanation was given taking example of a mode in which the distance control part 89 moves both the first heating plate 83 and the second heating plate 84. However, the present invention is not limited thereto. For example, an embodiment may be employed in which either one of the first heating plate 83 and the second heating plate 84 is moved, and the other is fixed.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:
1. A heating apparatus comprising:
a first accommodation part provided with a first heating part;
a second accommodation part provided with a second heating part, wherein
the first accommodation part is movable substantially in parallel to the second accommodation part and is capable of being superimposed on the second accommodation part to form a chamber in which the first heating part and the second heating part are disposed, wherein the first heating part and the second heating part are configured to have a substrate provided with a coating film disposed therebetween at a substrate position in the film thickness direction; and a distance control part which controls at least one of a first distance between the substrate position and the first heating part and a second distance between the substrate position and the second heating part, wherein the distance control part comprises a moving part which moves at least one of the first heating part and the second heating part substantially in parallel to the first heating part and the second heating part in the film thickness direction.

2. The heating apparatus according to claim 1, wherein the first heating part and the second heating part are arranged to be aligned in a vertical direction.

3. The heating apparatus according to claim 1, which further comprises a substrate holding part which holds the substrate disposed at the substrate position.

4. The heating apparatus according to claim 3, wherein either one of the first heating part and the second heating part which is disposed on a lower side of the substrate position in a vertical direction serves as the substrate holding part.

5. The heating apparatus according to claim 4, wherein the distance control part controls at least one of the first distance and the second distance such that either one of the first heating part and the second heating part which is disposed on an upper side of the substrate position in a vertical direction does not come in contact with the coating film.

6. The heating apparatus according to claim 1, wherein the chamber comprises a gas introduction part which introduces a gas.

7. The heating apparatus according to claim 6, wherein the gas introduction part is provided to sandwich at least one of the first heating part and the second heating part between the gas introduction part and the substrate position.

8. The heating apparatus according to claim 1, wherein the chamber comprises a gas exhaust part which exhausts a gas.

9. The heating apparatus according to claim 1, wherein the chamber comprises a gas introduction part which introduces a gas and a gas exhaust part which exhausts the gas, wherein the gas introduction part and the gas exhaust part are disposed to sandwich the substrate position.

10. A coating apparatus comprising:

a coating part which forms a coating film of a liquid material containing an oxidizable metal and a solvent on a substrate;

a heating part which heats the substrate having the coating film formed thereon; and a transporting part which transports the substrate between the coating part and the heating part, wherein a heating apparatus according to claim 1 is used as the heating part.

* * * * *

UNITED STATES PATENT AND TRADEMARK OFFICE
CERTIFICATE OF CORRECTION

| | | |
|---|---|---|
| PATENT NO. | : 9,027,504 B2 | Page 1 of 1 |
| APPLICATION NO. | : 13/484625 | |
| DATED | : May 12, 2015 | |
| INVENTOR(S) | : Hidenori Miyamoto and Tsutomu Sahoda | |

It is certified that error appears in the above-identified patent and that said Letters Patent is hereby corrected as shown below:

In the Claims
Col. 20, line 20 (claim 10), "substrate;" should be --substrate made of glass or resin;--.

Signed and Sealed this
First Day of March, 2016

Michelle K. Lee
*Director of the United States Patent and Trademark Office*